United States Patent [19]

Ochoa, Jr.

[11] Patent Number: 4,809,226
[45] Date of Patent: Feb. 28, 1989

[54] RANDOM ACCESS MEMORY IMMUNE TO SINGLE EVENT UPSET USING A T-RESISTOR

[75] Inventor: Agustin Ochoa, Jr., Vista, Calif.

[73] Assignee: The United States of America as represented by the United States Department of Energy, Washington, D.C.

[21] Appl. No.: 113,695

[22] Filed: Oct. 28, 1987

[51] Int. Cl.[4] ............................................. G11C 11/40
[52] U.S. Cl. ...................................................... 365/156
[58] Field of Search ................................. 365/154, 156

[56] References Cited

U.S. PATENT DOCUMENTS

| | | | |
|---|---|---|---|
| 4,070,653 | 1/1978 | Rao et al. ........................... | 365/222 |
| 4,130,892 | 12/1978 | Gunckel, II ......................... | 365/156 |
| 4,133,044 | 1/1979 | Gariazzo et al. ..................... | 365/78 |
| 4,247,862 | 1/1981 | Klein .................................... | 357/48 |
| 4,453,175 | 6/1984 | Ariizumi et al. ..................... | 357/41 |
| 4,481,524 | 11/1984 | Tsujide ............................... | 365/156 |
| 4,532,439 | 7/1985 | Koike .................................. | 365/156 |
| 4,541,006 | 9/1985 | Ariizumi et al. ..................... | 357/41 |
| 4,590,508 | 5/1986 | Hirakawa et al. .................... | 357/41 |

*Primary Examiner*—James W. Moffitt
*Attorney, Agent, or Firm*—George H. Libman; James H. Chafin; Judson R. Hightower

[57] ABSTRACT

In a random access memory cell, a resistance "T" decoupling network in each leg of the cell reduces random errors caused by the interaction of energetic ions with the semiconductor material forming the cell. The cell comprises two parallel legs each containing a series pair of complementary MOS transistors having a common gate connected to the node between the transistors of the opposite leg. The decoupling network in each leg is formed by a series pair of resistors between the transistors together with a third resistor interconnecting the junction between the pair of resistors and the gate of the transistor pair forming the opposite leg of the cell.

7 Claims, 3 Drawing Sheets

RANDOM ACCESS MEMORY IMMUNE TO SINGLE EVENT UPSET USING A T-RESISTOR

FIELD OF THE INVENTION

The present invention relates to the field of semiconductor memories, and more particularly to circuits designed to reduce random errors caused by exposure to extraneous energetic ions. The United States Government has rights in this invention pursuant to Contract No. DE-AC04-76DP00789 between the United States Department of Energy and AT&T Technologies, Inc.

BACKGROUND OF THE INVENTION

One type of CMOS P-well memory cell 10 shown in FIG. 1 comprises a first complementary pair of MOS transistors 12 in series with each other between a positive supply $V_{DD}$ and ground G and a second complementary pair 14 in series with each other between the positive supply and ground. The first pair of transistors 12 comprises an n-channel MOSFET 16 having its source (s) connected to ground and its drain (d) connected to the drain (d) of p-channel MOSFET 18. The source (s) of transistor 18 is connected to supply $V_{DD}$. The gates (g) of transistors 16, 18 are connected together. The second pair of transistors 14 comprises an n-channel MOSFET 22 having its source (s) connected to ground and its drain (d) connected to the drain (d) of p-channel MOSFET 26. The source (s) of MOSFET 26 in turn is connected to the supply $V_{DD}$. The gates (g) of transistors 22, 26 are connected together. All n-channel transistor substrates are at ground and not shown. All p-channel transistor substrates are at VDD and also not shown.

A first transfer gate MOSFET 32 has its source (s) connected to a positive bit line 36 and its drain (d) connected to the drains (d) of transistors 16, 18, and a second transfer gate MOSFET 34 has its source (s) connected to a negative bit line 38 and its drain (d) connected to the drains (d) of transistors 22, 26.

A first feedback resistor 28 is connected between the gates (g) of transistors 22, 26 and a n ode (n) interconnecting transistors 16, 18 and similarly, a second feedback resistor 30 is connected between the gates (g) of transistors 16, 18 at another node (n) interconnecting transistors 22, 26.

The first pair of transistors 12 establishes a signal on the positive bit line 36 in response to an address signal applied to the first transfer gate 32. The second pair of transistors 14 establishes a signal on the negative bit line 38 in response to a address signal applied to the second transfer gate 34.

In CMOS memory circuits of the type shown using P-well technology, random ionic interactions tend to cause undesirable coupling of adjacent p-channels or n-channels thereby to result in random memory errors. Dynamic random access memories (DRAMs), which are very sensitive to such ion interactions, lose information due to alpha particles generated from trace contaminants in the package material. Static random access memories (SRAMs) are less sensitive to low mass ions but undergo random hit losses when hit by heavier particles present in cosmic rays. Such particles may be encountered especially in outer space applications such as in satellites or spacecrafts orbiting the earth.

Semiconductor memories are susceptible to random errors caused by the interaction of energetic ions with the semiconductor material. When an ion penetrates the semiconductor, a localized charge packet is generated, which due to junction built-in electric fields and externally applied voltages, may appear as transient currents within the individual cells of the memories.

The feedback resistors 28, 30 are somewhat effective to reduce the transient currents and thereby reduce random errors occurring as a result of loss of information with cosmic ray interactions and other random hit losses. Indeed, CMOS P-well type SRAM memory cells of the type shown in FIG. 1 are commonly used in 16K memory chips; however, two problems are encountered in making 64K memory chips using this technology. First, the absolute value of the feedback resistors 28, 30 in memory units larger than 16K will increase the writing time for the units. This will have a deleterious effect on performance.

Second, the feedback resistors 28, 30 must be large. Since polysilicon resistors have large temperature coefficients, large changes in resistance occur with temperature change. Since the resistance value of each feedback 28, 30 resistor drops dramatically with increasing temperature, the low temperature value is much larger than that required to protect the cell, further increasing the writing time. It accordingly is desirable to improve upon presently known memory cells so as to cause them to be substantially immune to random errors due to energetic ionic interactions while maintaining good performance characteristics.

SUMMARY OF THE INVENTION

Accordingly, a primary object of the present invention is to provide a random access memory unit that is substantially immune to loss of information from interactions with energetic ionic particles.

Another object of the invention is to provide a static random access memory cell that is substantially immune to loss of information from interactions with energetic ionic particles in cosmic rays.

Another object is to provide new CMOS memory cells that are substantially immune to random errors caused by random interactions with energetic ionic particles.

Still another object is to make CMOS P-well technology memory cells that are substantially immune to random errors caused by random interactions with energetic ionic particles.

Another object of the invention is to provide a CMOS memory circuit using P-well technology in which a random energetic ionic interaction does not cause an undesirable transient signal thereby to result in random memory errors.

Still another object of the invention is to provide a memory circuit in which resistive decoupling prevents undesirable coupling of the transient response from one inverter to the other, large enough to cause cell upset, when subjected to random ionic interactions.

Yet another object of the invention is to provide CMOS memory cells in which feedback resistors are not so high in value as to preclude the use of the cells in a 64K memory due to reduced performance.

Another object of the invention is to provide a CMOS memory cell in which the resistances employed are relatively low in value to conserve area in the cell.

Additional objects, advantages, and novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out in the appended claims.

To achieve the foregoing and other objects, and in accordance with the purposes of the present invention as described herein, an improved random access memory cell includes at least two complementary transistor pairs connected between a voltage supply and ground, with the gates and drains of each pair connected together. A first transfer gate is connected to the drain of the n-channel transistor of the first transistor pair and a positive bit line, and a second transfer gate is connected to the drain of the n-channel transistor of the second transistor pair and a negative bit line. A resistance voltage divider between the transistors of each complementary pair is connected through another resistor to the gates of the other pair.

Still other objects of the present invention will become readily apparent to those skilled in this art from the following description, wherein there is shown and described a preferred embodiment of this invention. Simply by way of illustration, the invention will be set forth in part in the description that follows and in part will become apparent to those skilled in the art upon examination of the following or may be learned with the practice of the invention. Accordingly, the drawings and descriptions will be regarded as illustrative in nature and not as restrictive. The extension of this invention to n-well CMOS structures is apparent to those skilled in the art and is not discussed but included as an obvious application of the invention to the complementary design.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF A PREFERRED EMBODIMENT OF THE INVENTION

Figure 2:
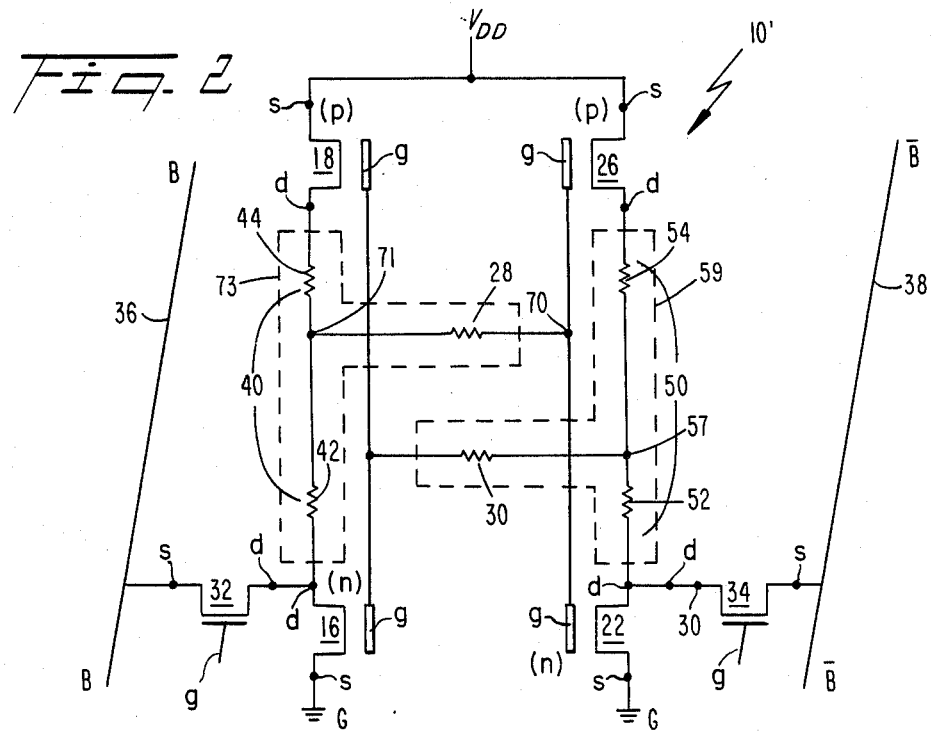
FIG. 2 is a schematic diagram of a random access memory improved in accordance with the principles of the invention.

With reference to the drawings, and more particularly to FIG. 2, there is disclosed a schematic diagram a preferred CMOS embodiment of the memory cell 10′ of the present invention. The cell 10′ is similar to cell 10 shown in FIG. 1 but includes the addition of a first voltage divider 40 consisting of resistors 42 and 44 in series with transistors 16, 18 and a second voltage divider 50 consisting of resistors 52 and 54 in series with transistors 22, 26. Resistors 42, 44 and 28 constitute a first "T" network 73 and resistors 52, 54 and 30 constitute a second "T" network 59 together forming an energetic ion interaction immunization circuit in accordance with the invention.

The gate electrodes (g) of transfer gates 32, 34 can be connected together to form a word line. The access diffusion of the first transfer gate 32 is connected to the positive bit line 36, and the access diffusion of the second transfer gate 34 is connected to the negative bit line 38. Each complementary transistor pair 12, 14 has a p-channel MOSFET 18, 26 having its source (s) connected to a positive supply $V_{DD}$ and each pair further has an n-channel MOSFET 16, 22 having its source (s) connected to a negative potential, i.e., ground G.

A signal applied to the gate (g) of the first transfer gate 32 causes a signal to be present on the positive bit line 36, and a signal applied to the gate electrode (g) of the second transfer gate 34 causes a signal to be present on the negative bit line 38. The other diffusion of the first transfer gate 32 is connected to the drain (d) of the first n-channel MOSFET 16 (can be a common diffused region) and similarly the second diffusion of the second transfer gate 34 is connected to the drain (d) of the second n-channel MOSFET 22 (can be a common diffusion).

The first pair of complementary MOSFETs 12 consists of first n-channel MOSFET 16 and first p-channel MOSFET 18 and is connected to the first transfer gate 32 for establishing a signal on the positive bit line 36 in response to a signal applied to the first transfer gate 32.

The second pair of complementary MOSFETs 14 consists of second n-channel MOSFET 22 and second p-channel MOSFET 26 and is connected to the second transfer gate 32 for establishing a signal on the negative bit line 38 in response to a signal applied to the second transfer gate 34.

In accordance with the invention, the gates (g) of the first p-channel MOSFET 18 and the first n-channel MOSFET 16 of the first complementary pair 12 are connected together and to a first feedback resistor 30 which in turn is connected to the voltage divider 50 in series with transistors 22 and 26 of the complementary pair 14. The voltage divider 50 consists of the first resistor 54 and the second resistor 52, and the first feedback resistor 30 is connected to the voltage divider 50 at node 57.

Similarly, the gates (g) of the second p-channel MOSFET 26 and the second n-channel MOSFET 22 of the second complementary pair are connected together and to feedback resistor 28 which in turn is connected to voltage divider 40 in series with the first p-channel MOSFET 18 and the first n-channel MOSFET 16 of the first complementary pair 12. The voltage divider 40 consists of resistor 42 and resistor 44, and the feedback resistor 28 is connected to voltage divider 40 at node 71.

Among the six transistors comprising the memory cell 10, transistors 18 and 26 are the most vulnerable to ion-induced memory errors (for P-well realization; N-well process will cause transistors 16 and 22 to be more vulnerable). This is particularly the case for P-well CMOS memory cells. However, in accordance with the invention, the feedback resistor 30 together with resistors 52 and 54 of the voltage divider 50 and the feedback resistor 28 together with resistors 42 and 44 of the voltage divider 40 protect the memory cell 10′ from errors caused by random energetic ion interaction. Preferably, the resistance value of resistor 54 is larger than that of resistor 52 (for P-well process) to improve immunity of the memory unit 10' against errors caused by random ion interaction. This relationship is particularly advantageous for protecting P-well CMOS memory cells from ionic interactions with the p-channels. Similarly, the value of resistor 44 preferably is greater than that of resistor 42.

The preferred embodiment of the invention utilizes an N-type substrate with P-well material deposited thereon, with the substrate of the n-channel MOSFETs 16, 22 formed by the P-well material and the substrate of the p-channel MOSFETs 18, 26 formed by the N-type substrate material. The n-channel source is connected to the P-well which is also connected to the source of lowest negative potential. The p-channel source is connected to the N-type substrate material which is connected to supply $V_{DD}$. Accordingly, the two transistors forming each complementary pair are isolated by junction isolation.

In implementing the principles of the invention in a CMOS cell, the following CMOS structure has proved to be effective. The substrate is formed of an N-type semiconductor material such as doped silicon. P-well material is diffused into the N-substrate where n-source channel devices are located. Next a first layer of polysilicon is applied to form the gates for both the p-channel and n-channel transistors. Next, a second layer of polysilicon is applied, and the three resistors forming the resistor T-network are applied in this layer; that is, the feedback resistor and the voltage divider resistors are formed in the second polysilicon layer. These resistors then are connected through the dielectrics to the gate (g), the source (s), and the drain (d) of the n-channel and p-channel MOSFETs.

Although the phenomena occurring within the random access memory unit of the invention are not fully understood, a theoretical explanation is provided herein in order to lend greater understanding of the operation of the invention.

Referring to FIG. 2, when current induced from a random energetic ionic interaction flows from p-channel MOSFET 26, voltage is induced across divider resistors 52 and 54. The values of the two resistors 52 and 54 of divider 50 together with feedback resistor 30, in combination forming the "T"-network 59 are selected by appropriate doping, whereby the voltage at node 57 is maintained below the threshold (e.g. 2.5 volts) of MOSFETs 16 and the node 57 remains low. Similarly, the values of the two resistors 42, 44 of divider 40 and feedback resistor 30, together forming the "T"-network 73, are selected by appropriate doping whereby the voltage at node 71 is maintained below the threshold of the MOSFET 22 and the node 71 remains low during energetic ion interaction with the drain of P MOSFET 18. Accordingly, at quiescence, a signal is stored at each node 57 and 71, and each node is protected from discharge from the opposite node and from the randomly generated voltages by the respective resistance T-networks 59 and 73.

Stated somewhat differently, a random energetic ionic interaction with the silicon forming the substrate material of the cell creates a short-lived charged plasma that acts like a source to substrate short-circuit. Thereby, any voltage retained at node 57 or 71 would be short-circuited to the substrate, and, in the absence of "T"-network 59, 73, lost by regeneration to the opposite state.

The time constant to which the plasma resulting from the single event upset is exposed is very short. In accordance with the invention, however, the voltage dividers 40, 50 increase the RC time constant of the path of the transient current flow as a result of energetic ionic interaction to ground. Since the inherent time constant of the random ionic interaction is short, the increased circuit time constant prevents the random ionic interaction from exerting a sufficiently high voltage within the cell to change its state.

By employing the principles of the invention, the resistance values of the feedback resistors and the voltage divider resistors are maintained as low as possible to provide a memory cell that is small and has short write and access times; and at the same time, the resistance values are sufficient to provide an RC time constant adequate t prevent discharge of the random ionic interaction induced voltage during a random ionic interaction.

Single event upsets can occur in several ways in a memory circuit. For purpose of illustration, the components of the memory circuit shown in FIG. 2 are assumed to have the following states: $V_{DD}$ equals 5 volts, a "1" is close to $V_{DD}$, and the N-type substrate is held at $V_{DD}$ the ground is zero volt, a "0" is close to ground, and the P-well substrate is held at ground; second p-channel MOSFET 26 is on; second n-channel MOSFET 22 is off; first p-channel MOSFET 18 is off; first n-channel MOSFET 16 is on; the node 57 represents a "1" and is close to $V_{DD}$; and the first node 71 represents a "0" and is close to ground.

If the single event upset from random ionic interaction occurs at the drain (d) of the first p-channel MOSFET 18, then a short circuit from the interaction would tend to cause the "0" at the node 71 to change to a "1" as a result of a short-circuit to the N-type substrate maintained at $V_{DD}$. However, the change in state at node 71 does not occur because of the presence of the first T-network 73 which includes feedback resistor 28 together with resistors 42, 44 of the voltage divider 40. These resistances provide an RC time constant which is greater than the time constant of the single event upset and divide down the voltage transient at node the drain of transistor 18 to a voltage at node 71 to a reduced value reducing coupling to pair 14, and the cell 10' will not change state. If the single event interaction occurs at the drain (d) of the MOSFET 22, then a short circuit from the interaction would tend to cause the "1" at the node 57 to change its state to "0" by a short circuit to the P-well substrate which is maintained at ground or zero potential. However, such a change of state does not occur because of the presence of the second T-network 59 which includes feedback resistor 30 together with resistors 52 and 54 of the voltage divider 50. These resistances provide an RC time constant which is greater than the time constant of the single event upset so that the state of the cell does not change. The P-well also reduces the high energy ion generated charge coupled to the drain of transistor 22.

Figure 1:
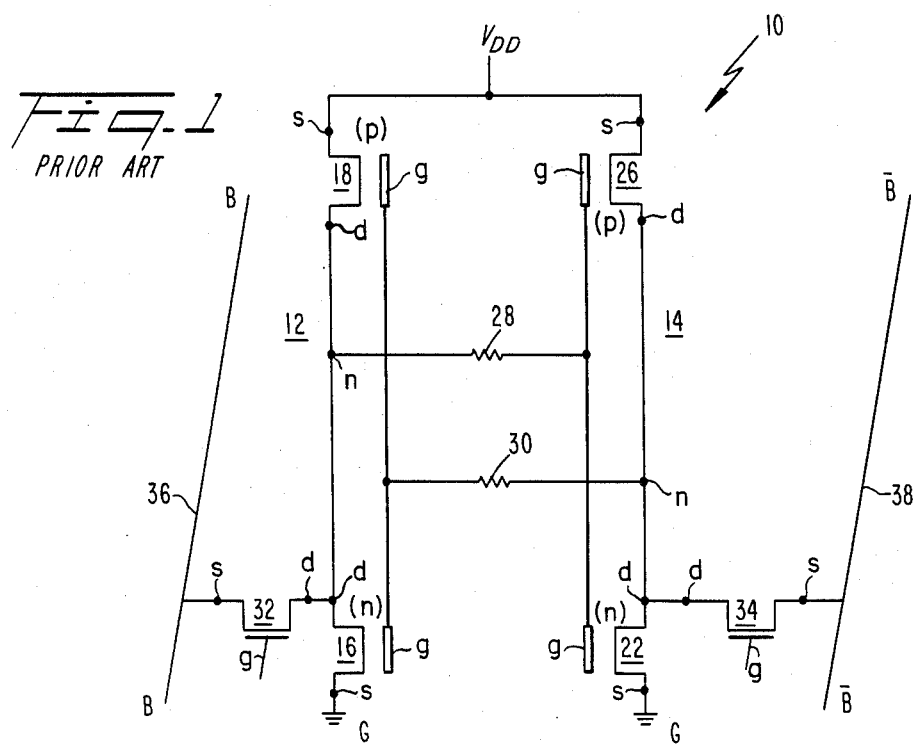
FIG. 1 is a schematic diagram of a prior art random access memory.
Figure 3:
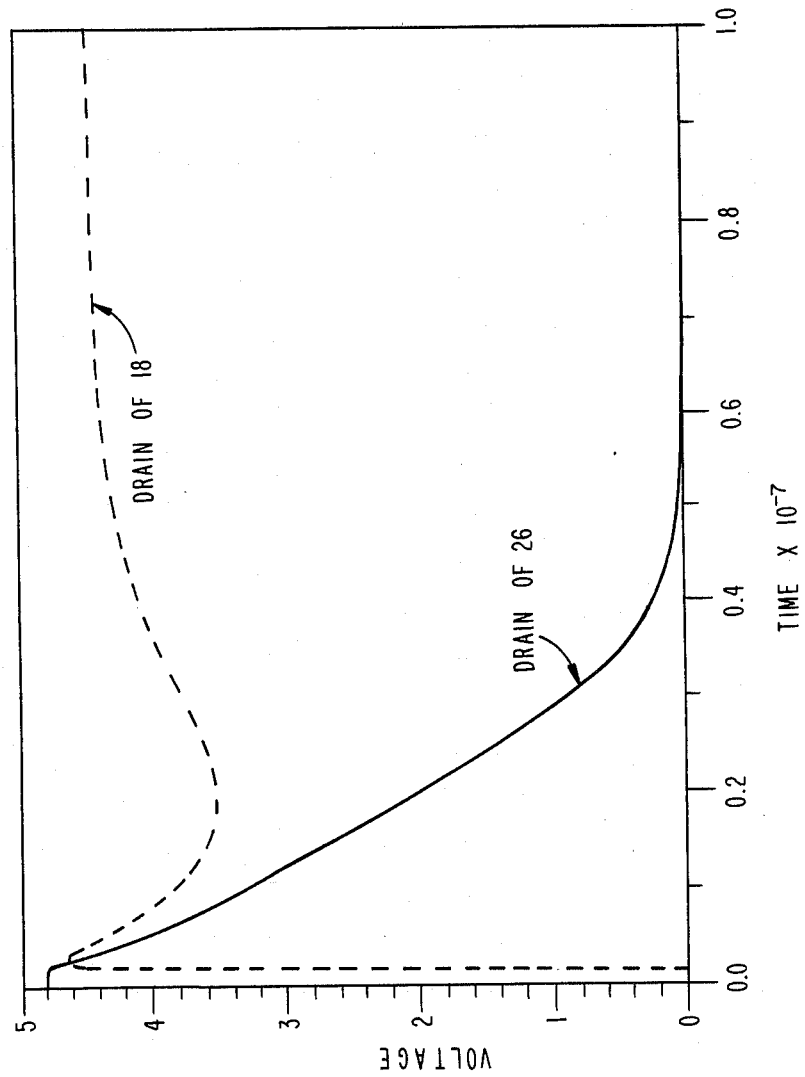
FIG. 3 is a graph showing the susceptibility of a random error due to a random energetic ionic interaction at a p-channel drain with a prior art memory circuit shown in FIG. 1, showing cell upset.

FIG. 3 is a graph of a simulation of a memory cell similar to prior art cell shown in FIG. 1 wherein all the resistances therein are set at 1 ohm. Assume that a random energetic ionic hit occurs at the drain of OFF p-channel MOSFET 26 and that prior to the hit node 57 is at state "0". The ion interaction is modeled by injecting a current pulse with a very fast rise time followed by a exponential decay into the drain (d) of the p-channel MOSFET 26 that is gated off. Herein, the peak current was 17 milliamperes, and the fall time constant was 0.25 nanosecond. This results in a total collected charge of 4.25 pico-coulombs, and the excitation reverses the state of the cell. After the hit, the state of the first node 71 is "0", and the state of the second node 57 is "1".

Figure 4:
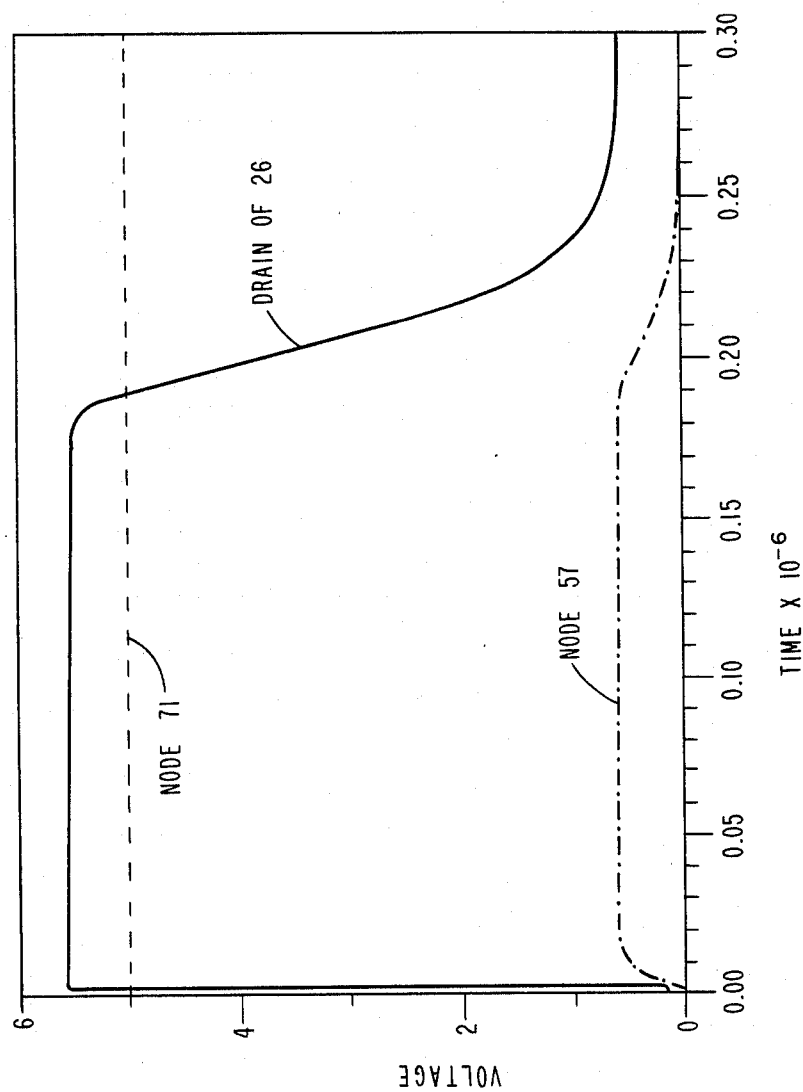
FIG. 4 is a graph showing the susceptibility of a random error due to a random energetic ionic interaction at a p-channel drain with a memory circuit having a T-network of resistances in accordance with the invention as shown in FIG. 2, showing recovery from the interaction.

With reference to FIG. 4, the result of a simulation employing a T-network of the invention after the memory states have been shifted as a result of the hit in FIG. 3 is shown. Both the divider resistance 44 of the first T-network 73 and the divider resistance 54 of the second T-network 59 shown in FIG. 2 are set at 40 kilohms. All the other resistances in the two T-networks are set at 1 ohm. The graph displays a random ionic hit at the drain (d) of p-channel MOSFET 26 which is biased off prior to this second hit. The ion interaction is modeled by injecting a current pulse with a very fast rise time followed by an exponential decay, into the drain (d) of the p-channel MOSFET 26 that is biased off. Thus, prior to this second hit, the state at node 57 is "0". For this simulation, the peak current was 100 milliamperes. The current pulse had again a very fast rise time followed by a 0.25 ns exponential decay time. Although a large transient is observed at the hit node (at the drain of the p-channel MOSFET 26), the effect of the divider resistor 54 is to completely decouple this transient so that the feedback does not become active, and the cell recovers to approximately its pre-hit state in approximately $0.23 \times 10^{-6}$ second after the 100 milliampere current was no longer applied. Note that 100 milliamperes is a gross overtest of the improved circuit.

Of even greater significance, the states at nodes 57 and 71 did not change as a result of the simulation of the second ionic hit. The small transient labeled "node 57" in the graph shows that the coupling point to the other device remains well below the switching threshold of N-MOSFET 16, and the drain of the p-channel MOSFET 18 remains at 5 volts throughout the entire simulated ionic hit episode.

The simulated ionic hit of 100 milliamperes is well above any expected ionic hit that would actually occur in operation. Nevertheless, the memory cell equipped with the T-network of resistors effectively resists even this excessive simulated ionic hit.

Hits to the n-channel MOSFETs 16, 22 are of less concern. A combination of shallow well and epitaxial substrate beginning material and the time constant of the feedback resistors 30 and 28 with gate and parasitic capacitances, will significantly reduce upset sensitivity to n-channel hits.

Other design considerations in designing a memory cell in accordance with the invention will take into account a number of different parameters including the geometries of the memory cell and the doping level of the silicon.

Numerous benefits result from employing the principles of the invention. For example, a CMOS memory circuit is immunized against random errors due to single event ionic interactions with the circuit. This is so particularly for CMOS structures using P-well technology where the p-channel gate is more sensitive to ion interactions. Making the first resistor (44 54) of each voltage divider larger than the second resistor (42, 52) provides to the p-channel MOSFET considerable protection against single event upset.

By employing the principles of the invention, resistive decoupling prevents random ionic interactions from causing random errors in the MOSFETs of a semiconductor memory circuit. The voltage divider between the drains of the MOSFETs enables the feedback resistors to be maintained at a relatively low value thereby to minimize space requirements.

The foregoing description of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto. For example, the transistors of a memory cell can be formed of bipolar transistors. Furthermore, although the preferred embodiment has been described using junction isolation, other methods of fabricating semiconductor memory units can be employed. For example, the principles of the invention can be employed with memory units fabricated in accordance with trench isolation, twin well technology, SOI, SOS, silicon on sapphire, and others.

For an N-well design, similar considerations lead to a complimentary memory circuit design. In such a design, the n-channel drain resistance in a T-network would be larger than the p-channel drain resistance and would protect the n-channel transistors from random ionic interaction upset.

It is noted that external contacts are at the drains of transistors 16 and 22 in the embodiment shown in FIG. 2. This arrangement is chosen for maximum protection of the n-channel MOSFETs 16, 22 for resistive decoupling while at the same time protecting the p-channel MOSFETs 18, 26 with the voltage dividers 40, 50. This kind of arrangement is preferred for memory cells employing silicon, gallium arsenide, or gallium aluminum arsenide among others.

On the other hand, if maximum protection from random ionic interactions using resistive decoupling were desired for p-channel MOSFETs while at the same time protecting the n-channel MOSFETs gates with voltage dividers, then the output nodes would be at the drains of transistors 18 and 26.

It does not matter at which point along the voltage divider the output node is taken. What is important is that the voltage divider provide a voltage to the feedback resistor for the opposite side of the memory cell that is of reduced magnitude from the full transient and can be below the threshold voltage of the transistor.

What is claimed is:

1. A semiconductor memory cell having improved immunity to random errors caused by ion interactions, comprising:
    a first complementary pair of transistors having a first common input means and connected in series with each other between first and second voltage sources;
    a first voltage divider comprising first and second resistors connected in series between said first complementary pair of transistors;
    a second complementary pair of transistors having a second common input means and connected in series with each other between said first and second voltage sources;
    a second voltage divider comprising third and fourth resistors connected in series between said second complementary pair of transistors;

a first feedback resistor interconnecting a first node between said third and fourth resistors and said first common input means;

a second feedback resistor interconnecting a second node between said first and second resistors and said second common input means;

first transfer gate means for interconnecting said first complementary pair of transistors and a positive bit line; and second transfer gate means for interconnecting said second complementary pair of transistors and a negative bit line.

2. The cell of claim 1, wherein said first resistor has a resistance that is greater than the resistances of said second resistor and said third resistor has a resistance that is greater than the resistances of said fourth resistor.

3. The cell of claim 1, wherein said transistors comprise CMOS transistors.

4. The cell of claim 1, wherein said CMOS transistors are formed of p-well devices.

5. A semiconductor memory cell having improved immunity to random errors caused by energetic ion interactions, comprising:

first and second complementary MOS transistors in series with each other between first and second voltage sources, said first and second transistors having gates connected together;

third and fourth complementary MOS transistors in series with each other between said first and second voltage sources, said third and fourth transistors having gates connected together;

a first transfer gate connected between said first and second transistors and a positive bit line;

a second transfer gate connected between said third and fourth transistors and a negative bit line;

a first T-network comprising first, second and third resistors connected to a first common node, said first and second resistors connected respectively to the drains of said first and second transistors, and the third resistor connected to the gates of said third and fourth transistors; and a second T-network comprising fourth, fifth and sixth resistors connected to a second common node, said fourth and fifth resistors connected respectively to the drains of said third and fourth transistors, and the sixth resistor connected to the gates of said first and second transistors.

6. The cell of claim 5, wherein said first and third transistors are p-channel MOSFETs and said second and fourth transistors are n-channel MOSFETs, said first resistor having a higher resistance than the resistances of said second and third resistors, and said fourth resistor having a higher resistance than the resistances of said fifth and sixth resistors.

7. The cell of claim 5, wherein said MOSFET transistors are formed of p-well devices.

* * * * *